United States Patent
Dougan et al.

(10) Patent No.: US 6,902,440 B2
(45) Date of Patent: Jun. 7, 2005

(54) METHOD OF FORMING A LOW K DIELECTRIC IN A SEMICONDUCTOR MANUFACTURING PROCESS

(75) Inventors: James N. Dougan, Round Rock, TX (US); Lesley A. Smith, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/690,060

(22) Filed: Oct. 21, 2003

(65) Prior Publication Data

US 2005/0085082 A1 Apr. 21, 2005

(51) Int. Cl.[7] ............................................. H01L 21/302
(52) U.S. Cl. ........................................ 439/704; 257/58
(58) Field of Search ............................ 257/58, 642–652; 438/770, 798, 931, 704–712

(56) References Cited

U.S. PATENT DOCUMENTS

| | | | |
|---|---|---|---|
| 5,607,773 A | * | 3/1997 | Ahlburn et al. ............. 428/427 |
| 6,386,212 B1 | * | 5/2002 | Robinson ..................... 134/1.3 |
| 2002/0189643 A1 | | 12/2002 | Chen |
| 2003/0068853 A1 | | 4/2003 | Conti |
| 2003/0087534 A1 | | 5/2003 | Mallikarjunan |
| 2003/0114000 A1 | | 6/2003 | Noguchi |
| 2003/0155657 A1 | * | 8/2003 | Tonegawa et al. .......... 257/774 |
| 2003/0228769 A1 | * | 12/2003 | Chen et al. .................. 438/761 |

* cited by examiner

*Primary Examiner*—Matthew Smith
*Assistant Examiner*—Calvin Lee
(74) *Attorney, Agent, or Firm*—James L. Clingan, Jr.

(57) ABSTRACT

A low K dielectric composite layer is formed of a low k barrier layer and a low K dielectric layer on the barrier layer. The barrier layer, which is deposited with the result of having a hydrophobic top surface, is treated with an oxygen plasma to convert the surface from hydrophobic to hydrophilic. A subsequent water-based clean is very effective in removing yield-reducing defects on the barrier layer due to the conversion of the surface of the barrier layer. After the water-based clean, the low K dielectric layer is formed on the surface of the barrier layer to achieve the composite layer that has a low K.

21 Claims, 1 Drawing Sheet

METHOD OF FORMING A LOW K DIELECTRIC IN A SEMICONDUCTOR MANUFACTURING PROCESS

FIELD OF THE INVENTION

This invention relates to integrated circuit manufacturing, and more particularly, to the formation of low k dielectric films in integrated circuit manufacturing.

RELATED ART

In the manufacturing of semiconductors, one of the developments has been the use of low k dielectrics-for an interlayer dielectric (ILD), the layer between conducting layers above the semiconductor substrate. This low K dielectric is to reduce capacitive coupling between conductors that are used as interconnect. Reducing this capacitive coupling is particularly important in cases where speed is a high priority, which is often the case. The low K materials are typically neither the best insulators nor the easiest to manufacture with high yield. Often barrier layers and capping layers are required in order to achieve all of the characteristics necessary for successful operation. These additional layers add steps, which complicate the process and potentially introduce yield problems.

Thus, there is a need for low K dielectrics in semiconductor manufacturing that can be made with less adverse effects on yield.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one form, a low k barrier layer, which is deposited with a hydrophobic surface, is treated with an oxygen plasma to convert the surface to being hydrophilic. The hydrophilic surface is then cleaned with a scrub. The scrub has a significantly increased effectiveness due to the surface being hydrophilic. After the treatment a low K dielectric layer is formed on the surface. This is better understood by reference to the drawings and the following description.

Figure 1:
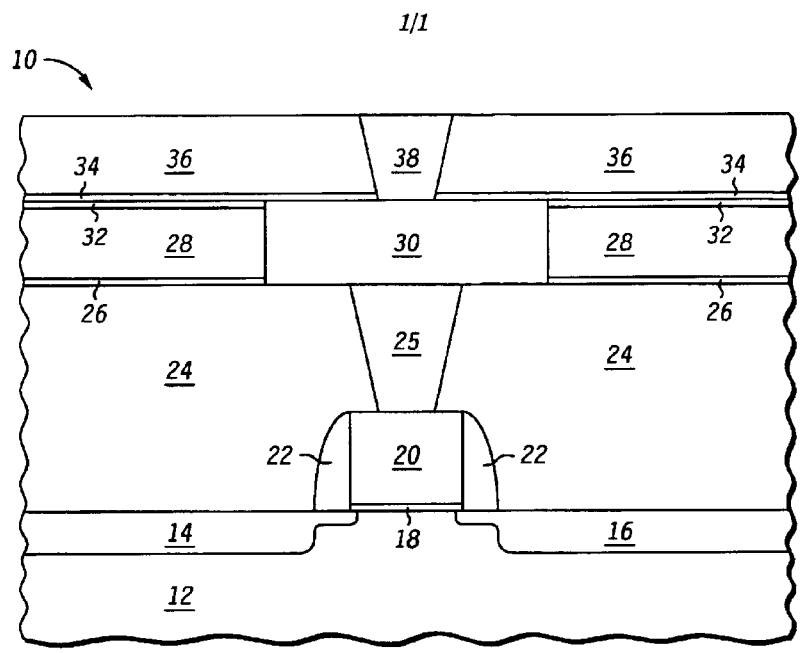
FIG. 1 is a cross section of a semiconductor device structure made according to an embodiment of the invention.

Shown in FIG. 1 is a semiconductor device 10 comprising a semiconductor substrate 12, a drain region 14 formed in substrate 12, a source region 16 formed in substrate 12, a gate dielectric 18 over substrate 12 and substantially between drain 14 and source 16, a gate 20 over gate dielectric 18, a sidewall spacer 22 around gate 22, a dielectric layer 24 over and around gate 20, a contact 25 on gate 20, a low k barrier dielectric layer 26 on dielectric layer 24, a low K dielectric layer 28 on low k barrier dielectric layer 26, a capping layer 32 on low K dielectric layer 28, a conductive layer 30 on via 25 and surrounded by layers 26, 28, and 30, a low k barrier layer 34 on capping layer 32, a low K dielectric layer 36 on low k barrier layer 34, and a via 38 on conductive layer 30 and surrounded by layers 34 and 36. Semiconductor substrate 12 is preferably an SOI substrate in which the semiconductor is silicon or it can be another type of semiconductor substrate of another semiconductor material. Gate 20 is preferably silicon but could be other materials such as a metal or composite of different layers. Contact 25 is preferably tungsten but could be another type of conductive material. Via 38 is preferably copper but could be another type of conductive material. Conductor layer 30 is preferably copper but may be another conductive material. Capping layer 32 is preferably an oxide formed using tetraethylorthosilicate (TEOS), but may other dielectric materials. Dielectric 24 is a composite of layers with the top layer preferably being either SiCOH or an oxide formed using fluorine and TEOS (FTEOS). A CMP process is applied to dielectric layer 24 so that the material on the surface of layer 24 after the CMP processing may vary. A preferred combination of material over layer 24 prior to performing the CMP process is silicon rich oxide, silicon rich oxynitride, TEOS oxide, which results in the top surface of layer 24 not being the same across the wafer on which device 10 is performed. Semiconductor device 10 is a conventional structure that can be formed by conventional means except for the method in forming the composite layer of low k barrier layer 26 and low K dielectric 28 and the composite layer of low k barrier layer 34 and low K dielectric layer 36.

Figure 2:
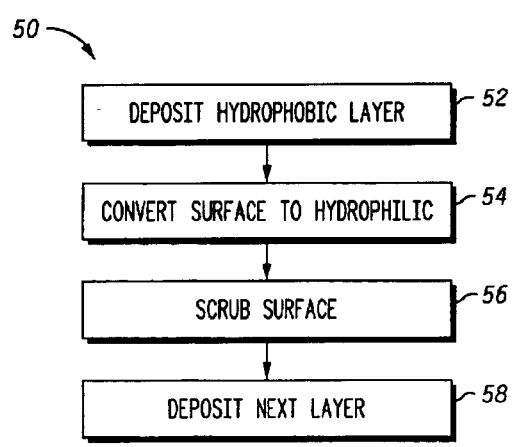
FIG. 2 is a flow diagram of a process according the embodiment of the invention used in making the device of FIG. 1.

The method of forming these composite layers is shown in flow diagram 50 of FIG. 2. Flow diagram 50 comprises steps 52, 54, 56, and 58. In step 52 a layer is deposited that has a hydrophobic surface, which is true of low k barrier layers 26 and 34. Barrier layers 26 and 34 are preferably SiCN. Low K dielectric layers 28 and 36 are preferably SiCOH. SiCN has been found to be an effective barrier in protecting SiCOH from layer 24. SiCN has the characteristic of having a hydrophobic surface. The SiCN also has been found to have particles on its surface. A scrub clean has been found not remove all of the particles. One possible reason for the clean being less than fully effective is that the surface of the SiCN layer, as deposited, is hydrophobic. Furthermore a scrub clean has been found to damage the structure of the SiCN creating a new type of defect. Step 54 is to convert the surface of the SiCN layer from being hydrophobic to hydrophilic. This is achieved with an oxygen plasma. The deposition of the SiCN and the subsequent plasma treatment of the SiCN layer are preferably performed in situ. Because SiCN is a plasma deposition, the subsequent oxygen plasma step can easily be performed without having to remove the wafers from the deposition chamber. Thus, layer 26 is deposited and then treated in the same chamber. In the same way but after the deposition and CMP processing of conductor 30, layer 34 is also deposited and treated in the same chamber.

Step 56 is to perform a scrub of the surface of the layer that has been plasma treated. Thus layer 26 is treated with a scrub clean after layer 26 has been treated with oxygen plasma. This is also true for layer 34. The scrub clean is a water-based clean. The water is preferably de-ionized and further includes ammonium hydroxide. This is a conventional composition for a water-based clean such as a scrub clean.

Step 58 is to perform the deposition of the next layer, which is low K dielectric layer 28 over low k barrier layer 26 and low K dielectric layer 36 over barrier layer 34. This combination of steps 52–58 combines to complete a composite layer useful as a low K dielectric.

One theory for the benefit of this method is that the plasma deposition of the barrier layer results in particles on the surface of the barrier which can cause yield-reducing defects; these particle are not effectively removed by a scrub because the surface of the barrier layer is hydrophobic; and the post-deposition plasma treatment of the surface of the barrier layer converts the surface of the barrier layer to hydrophilic so that the scrub is effective in removing the particles without the subsequent generation of a new defect type. Another theory is that the plasma treatment causes there to be less adhesion between the particles and the barrier layer so the subsequent scrub is more effective. In any event, the process has resulted in a significant improvement in yield.

In the foregoing specification, the invention has been described with reference to specific embodiments. However, one of ordinary skill in the art appreciates that various modifications and changes can be made without departing from the scope of the present invention as set forth in the claims below. For example, other dielectric and barrier materials may be used that benefit from a plasma treatment followed by a water-based clean. Another material may also be hydrophobic as deposited and be converted to hydrophilic with a plasma treatment. The plasma treatment may be other than by oxygen. The low K material may be something other than SiCN and SiCOH and may be spun-on instead of by plasma. The water-based clean need not necessarily be a scrub process but simply using a water-based solution without requiring a scrubber. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a layer over a semiconductor substrate comprising:
   providing a semiconductor substrate;
   forming a first dielectric layer overlying said substrate, said first dielectric layer comprising a hydrophobic surface;
   converting said hydrophobic surface to a hydrophilic surface;
   scrubbing said hydrophilic surface; and
   forming a second dielectric layer overlying said first dielectric layer;
   wherein converting said hydrophobic surface to said hydrophilic surface is by an oxygen plasma.

2. The method of claim 1, wherein said first dielectric layer comprises silicon, carbon and nitrogen.

3. The method of claim 1, wherein said second dielectric layer comprises silicon, carbon, oxygen and hydrogen.

4. The method of claim 1, wherein the scrubbing said hydrophilic surface is with a water-based clean.

5. The method of claim 4, wherein said water-based clean comprises ammonium hydroxide.

6. The method of claim 5, wherein said first dielectric comprises silicon, nitrogen, and carbon.

7. The method of claim 4, wherein the step of forming said first dielectric layer and the step of converting said hydrophobic surface to a hydrophilic surface, are performed in situ.

8. The method of claim 1, wherein forming said first dielectric layer and converting said hydrophobic surface to a hydrophilic surface are performed in situ.

9. The method of claim 1, wherein forming the first dielectric is plasma deposited and converting is by plasma.

10. A method of forming a layer over a semiconductor substrate comprising:
    providing a semiconductor substrate;
    forming a first dielectric layer overlying said substrate;
    treating said first dielectric layer with an oxygen plasma;
    cleaning said first dielectric layer with a water-based solution; and
    forming a second dielectric layer overlying said cleaned first dielectric layer;
    wherein the treating said first dielectric layer with said oxygen plasma is such that a hydrophobic surface of said first dielectric layer is converted to a hydrophilic surface.

11. The method of claim 10, wherein the step of cleaning said first dielectric layer comprises scrubbing said first dielectric layer with said water-based solution.

12. The method of claim 11, wherein said water-based solution comprises ammonium hydroxide.

13. The method of claim 12, wherein said first dielectric layer comprises silicon, carbon and nitrogen.

14. The method of claim 10, wherein said first dielectric layer comprises silicon, carbon and nitrogen.

15. The method of claim 14, wherein the step of forming said first dielectric layer occurs in a first chamber.

16. The method of claim 15, wherein the step of treating said first dielectric layer with said oxygen plasma occurs in said first chamber.

17. A method for forming a semiconductor structure:
    providing a semiconductor substrate;
    forming a first dielectric layer comprising silicon, carbon and nitrogen overlying said substrate;
    treating said first dielectric layer with an oxygen plasma;
    scrubbing said first dielectric layer; and
    forming a second dielectric layer overlying said first dielectric layer;
    wherein said first dielectric layer has a hydrophobic surface; and
    wherein said step of treating said first dielectric layer converts substantially all of said hydrophobic surface to a hydrophilic surface.

18. The method of claim 17, wherein the step of scrubbing comprises scrubbing with a water-based cleaning solution.

19. The method of claim 18, wherein said water-based cleaning solution comprises ammonium hydroxide.

20. The method of claim 19, wherein the step of scrubbing comprises mechanical cleaning and chemical cleaning.

21. The method of claim 17, wherein forming the first dielectric layer comprises: forming the first dielectric layer of silicon of silicon, carbon, and nitrogen; wherein forming the first dielectric and treating the first dielectric layer are performed in situ.

* * * * *